United States Patent [19]
Okada et al.

[11] 3,935,478
[45] Jan. 27, 1976

[54] NON-LINEAR AMPLIFIER

[75] Inventors: Takashi Okada, Yamato; Kimitake Utsunomiya, Tokyo, both of Japan

[73] Assignee: Sony Corporation, Tokyo, Japan

[22] Filed: July 29, 1974

[21] Appl. No.: 492,838

[30] Foreign Application Priority Data
Aug. 10, 1973 Japan................................ 48-90150
Aug. 10, 1973 Japan................................ 48-90151

[52] U.S. Cl. .................. 307/229; 307/296; 330/22; 330/23; 330/24; 330/32; 330/40
[51] Int. Cl.² ........................................ G06G 7/12
[58] Field of Search......... 330/23, 38 M, 24, 22, 40, 330/32; 307/229, 230, 296; 328/142, 144, 145; 235/150.53, 193.5, 197

[56] References Cited
UNITED STATES PATENTS
3,573,645 4/1971 Wheatly ...................... 330/38 M X
3,689,752 9/1972 Gilbert ........................... 307/229 X OTHER PUBLICATIONS
Viswanathan et al., "Simple 4-Quadrant Analogue Multiplier" Electronics Letters, Vol. 6, No. 23, Nov. 12, 1970, pp. 725–726.
Liversidge, "Low–Cost Reciprocal–Law Circuit," Electronics Letters, Vol. 6, No. 13, June 25, 1970, pp. 389–390.

*Primary Examiner*—James B. Mullins
*Attorney, Agent, or Firm*—Lewis H. Eslinger; Alvin Sinderbrand

[57] ABSTRACT

A non-linear amplifier is disclosed including an amplifying transistor for amplifying an input signal, an output amplified signal being derived from the amplifying transistor. A series of PN junctions is provided to supply a determined bias voltage to the amplifying transistor. An emitter-follower stage, comprised of at least one emitter-follower transistor amplifier, is connected to an input of the amplifying transistor for compensating the bias voltage applied thereto. In one embodiment, the input signal is amplified by a power of n wherein n PN junctions are connected in parallel with (n-1) emitter-follower transistor amplifiers. The input signal is supplied through the (n-1) emitter-followers to the base electrode of the amplifying transistor. In an alternative embodiment, the input signal is amplified by a power of 1/n wherein (n-1) PN junctions are coupled to the emitter electrode of the amplifying transistor and (n-1) emitter-follower transistors are connected in cascade to the base electrode of the amplifying transistor. In this latter embodiment, an output transistor is connected to the output of the emitter-follower stage.

6 Claims, 6 Drawing Figures

NON-LINEAR AMPLIFIER

BACKGROUND OF THE INVENTION

This invention relates to a non-linear amplifier and, more particularly, to a transistorized non-linear amplifier wherein the input signal is amplified by a power of $n$ or by a power of $1/n$, wherein $n$ is a positive integer greater than 1.

Transistorized non-linear amplifiers are known wherein the amplification factor admits of an exponential characteristic. That is, the amplified output signal is exponentially related to the input signal. Such prior art non-linear amplifiers generally consist of an amplifying transistor having a base electrode to which the input signal is applied and a collector electrode from which the amplified signal is derived. Additionally, a first series of PN junctions are connected between the amplifying transistor base electrode and a reference potential, and a second series of PN junctions are provided to connect the amplifying transistor emitter electrode to such reference potential.

Although the various operating characteristics of the PN junction devices are well as the amplifying transistor can be selected to be substantially equal, an attendant disadvantage of such prior art non-linear amplifiers is that the output amplified signal and, in particular, the output current is temperature dependent. Stated otherwise, the output current includes a component that is sensitive to changes in temperature. Consequently, the amplification attained by such non-linear amplifier can not be maintained constant throughout a range of temperature variations, resulting in deleterious affects.

OBJECTS OF THE INVENTION

Therefore, it is an object of the present invention to provide a non-linear amplifier having an amplification factor that is independent of temperature variations.

It is another object of the present invention to provide an improved non-linear amplifier wherein an input signal is amplified by a power of $n$.

Another object of this invention is to provide an improved non-linear amplifier wherein an input signal is amplified by a power of $1/n$.

A still further object of the present invention is to provide an improved non-linear amplifier that is temperature stable and that is readily adapted to be constructed in integrated circuit configuration.

A still further object of the present invention is to provide an improved non-linear amplifier wherein an output signal is related to an input signal by a power of $n$ or by a power of $1/n$ regardless of variations in temperature.

Various other objects and advantages of the present invention will become clear from the ensuing detailed description of certain preferred embodiments, and the novel features will be particularly pointed out in the appended claims.

SUMMARY OF THE INVENTION

In accordance with the present invention a non-linear amplifier is comprised of an amplifying transistor for receiving an input signal and for producing an amplified output signal; a series of PN junctions for producing a predetermined bias voltage to be supplied to the amplifying transistor; and an emitter-follower stage including at least one emitter-follower transistor connected to the input of the amplifying transistor. In one embodiment wherein the input signal is amplified by a factor of $n$, the input signal is supplied through the emitter-follower stage to the input of the amplifying transistor and the series of PN junctions is connected to the emitter-follower stage to produce the bias voltge thereat. In another embodiment wherein the input signal is amplified by a power of $1/n$, the series of PN junctions is connected in the base-emitter circuit of the amplifying transistor to provide the bias voltage thereat and the emitter-follower stage is connected substantially in parallel with the base-emitter circuit of the amplifying transistor.

BRIEF DESCRIPTION OF THE DRAWINGS

The following detailed description will best be understood in conjunction with the accompanying drawings wherein.

DETAILED DESCRIPTION OF CERTAIN OF THE PREFERRED EMBODIMENTS

Figure 1:
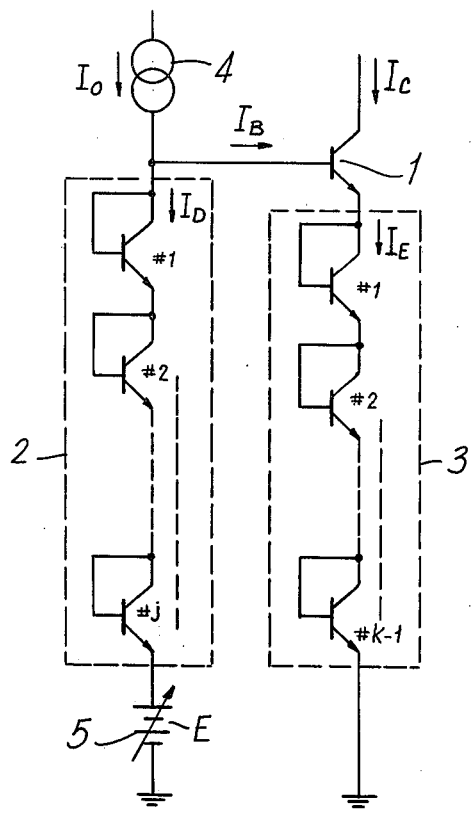
FIG. 1 is a schematic representation of a typical prior art non-linear amplifier.

Referring now to the drawings, wherein like reference numerals are used throughout, and in particular to FIG. 1, there is Schematically illustrated a representation of a typical prior art non-linear amplifier. This non-linear amplifier is comprised of an amplifying transistor 1, a first series of P-N junctions 2 and a second series of P-N junctions 3. The amplifying transistor 1 includes a base electrode adapted to receive an input signal applied thereto by a constant current source 4 of conventional design. The base electrode of the amplifying transistor is further connected through a series of P-N junctions 2 to a reference voltage source 5. The series of P-N junctions is here formed of j diode-connected transistors wherein each such transistor includes a base electrode connected directly to its collector eletrode.

The emitter electrode of the amplifying transistor 1 is connected through the series 3 of P-N junctions to a reference potential, such as ground. The series 3 of P-N junctions is formed of (k-1) diode-connected transistors, similar to the diode-connected transistors of series 2. The operating characteristics of the j diode-connected transistors included in the series 2 as well as the operating characteristics of the (k-1) diode-connected transistors in the series 3 and the amplifying transistor 1 are selected to be substantially equal. The output amplified signal produced by the illustrated non-linear amplifier is derived from the collector electrode of the amplifying transistor 1.

The operation of the prior art non-linear amplifier, as illustrated in FIG. 1, will now be mathematically described. Let it be assumed that the voltage drop across each P-N junction of the series 2, i.e., the base-emitter voltage drop across each diode-connected transistor, is equal to $V_1$. Let it further be assumed that the voltage drop across the base-emitter junction of the amplifying transistor 1 as well as the voltage drop across each P-N junction included in the series 3 is equal to $V_2$. Now, if the voltage produced by the reference voltage source 5 is E, then the voltage at the base electrode of the amplifying transistor 1 can be expressed as follows:

$$j \cdot V_1 + E = kV_2 \quad (1)$$

It is appreciated that the base current $I_B$ flowing through the amplifying transistor 1 is negligible when compared with the input signal current $I_o$, supplied by the constant current source 4, the current $I_D$ flowing through the series 2 of P-N junctions, the current $I_E$ flowing through the series 3 of P-N junctions and the output current $I_C$ flowing in the collector circuit of the amplifying transistor 1. Consequently, the base current $I_B$ can be omitted to derive the following valid relationships between the respective currents:

$$I_o \div I_D = I_{S1} \cdot e^{q/kT \, V_1} = I_{s1} e^{\alpha V_1} \quad (2)$$

$$I_C \div I_E = I_{S2} \cdot e^{q/kT \, V_2} = I_{s2} e^{\alpha V_2} \quad (3)$$

wherein $I_{S1}$ and $I_{S2}$ are the input current coefficients of the respective P-N junctions in the series 2 and 3 (i.e., the input coefficients of the respective diode-connected transistors), $q$ is the charge of an electron, $k$ is the Boltzmann's constant, T is the absolute temperature in degrees Kelvin and $\alpha$ is equal to $q/kT$.

Solving for the voltages $V_1$ and $V_2$, the ewuations (2) and (3) may be rewritten as follows:

$$V_1 = \frac{1}{\alpha} \cdot \ln \frac{I_o}{I_{S1}} \quad (4)$$

$$V_2 = \frac{1}{\alpha} \cdot \ln \frac{I_C}{I_{S2}} \quad (5)$$

The votages $V_1$ and $V_2$, as expressed in equations (4) and (5) can now be substituted into equation (1) to obtain a matematical expression for the output current $I_C$ as follows:

$$I_C = \frac{I_{S2}}{I_{S1}^{j/k}} \cdot e^{\alpha \cdot E/k} \cdot I_o^{j/k} \quad (6)$$

As is apparent, the output current $I_C$ is proportional to the input current $I_o$ by a power of $j/k$. That is, the non-linear amplifier illustrated in FIG. 1 is capable of amplifying the input current by a power of $j/k$. It is appreciated that both $j$ and $k$ can be selected to any desired amount. Accordingly, merely by selecting the number of P-N junctions included in each series, the power of amplification can be an integer wherein $j/k$ is equal to $n$ or, as an alternative, the amplification power $j/k$ can be selected as $1/n$.

An examination of equation (6) above indicates that the output current $I_C$ includes the factor $$e^{\alpha \cdot E/k}$$

which means that the output current is dependent upon the temperature T. Thus, the prior art non-linear amplifier is undesirably temperature dependent whereby the output current $I_C$ is deleteriously effected by variations in temperature.

Figure 2:
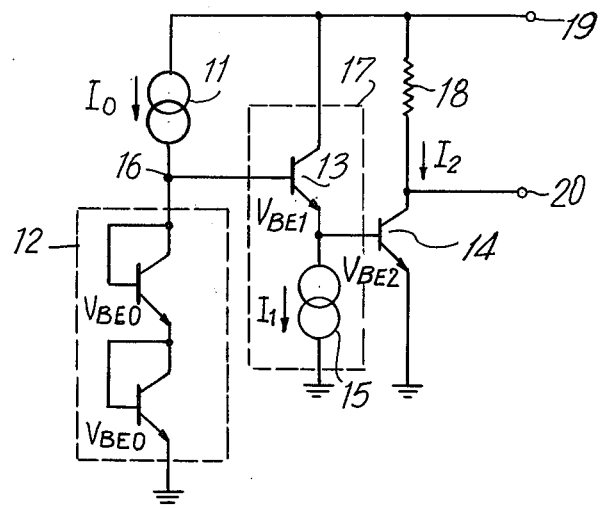
FIG. 2 is a schematic representation of a specific non-linear amplifier in accordance with the teachings of the present invention.

The present invention overcomes the problem of temperature-sensitive characteristics of a non-linear amplifier as will now be seen. A simplified schematic illustration of one embodiment of a nonlinear transistor amplifier in accordance with the present invention is illustrated in FIG. 2 wherein the input signal is amplified by a power of 2. As there illustrated, the simplified non-linear transistor amplifier is comprised of an amplifying transistor 14, a series of P-N junctions 12 and an emitter-follower stage 13. The amplifying transistor 14 is adapted to receive an input signal to be amplified, the input signal being supplied by an input current souce 11 coupled to a junction 16. The emitter-follower stage 17 is interconnected between the junction 16 and the base electrode of the amplifying transistor 14 so as to supply the input signal to the amplifying transistor. In this simplified cirucit embodiment, the emitter-follower stage 17 is comprised of a transistor 13 having a constant current source 15 connected in its emitter circuit. The emitter-follower transistor 13 is connected to a source of energizing potential 19.

The series of P-N junctions 12 is comprised of two junctions connected in series between the junction 16 and a reference potential, such as ground. In the illustrated embodiment, each of the P-N junctions is formed of a diode-connected ftransistor wherein the base and collector electrodes thereof are interconnected. The series of P-N junctions is adapted to provide a bias voltage for the amplifying transistor 14, which bias voltage is compensated by the emitter-follower stage.

The amplifying transistor 14 is disposed in the common-emitteer configuration whereby the amplified signal is derived at the collector electrode and is supplied to an output terminal 20. As seen, the collector electrode of the amplifying transistor is connected to the source of energizing potential 19 by a load resistor 18.

The operating characteristics of the amplifying transistor 14, the emitter-follower transistor 13 and the diode-connected transistors included in the series of P-N junctions 12 are substantially the same. It is appreciated that such matched operating characteristics are readily obtained in accordance with conventional integrated circuit tehcnology. Therefore, preferably, the illustrated non-linear amplifier is constructed as an integrated circuit wherein the various transistor components exhibit substantially the same operating characteristics.

The operation of the illustrated non-linear amplifier will now be described. Let it be assumed that the voltage drop across each of the P-N junctions included in the series 12 is designated as $V_{BE0}$. It is appreciated that if each P-N junction is formed of a diode-connected transistor, the voltage drop thereacross is equal to the base-emitter forward voltage drop across such transistor. Let it also be assumed that the base-emitter voltage drop across the emitter-followr transistor 13 included in the emitter-follower stage 17 is designated a $V_{BE1}$ and that the base-emitter voltage drop across the amplifying transistor 14 is designated as $V_{BE2}$. When the voltage at junction 16 is considered, the following relation obtains:

$$2V_{BE0} = V_{BE1} + V_{BE2} \quad (7)$$

If the current amplification coefficient $h_{FE}$ of each of the amplifying transistor 14 and the emitter-follower transistor 13 is selected to be relatively large, it is appreciated that the base currents flowing in these respective transistors are negligible and, for the purpose of the instant discussion, can be neglected. Accordingly, the input signal current $I_o$ obtained from the input current source 11, the emitter-follower stage current $I_1$ obtained from the constant current source 15 and the output current $I_2$ of the amplifying transistor 14 can be mathematically expressed as:

$$I_o \div I_S \cdot e^{q/kT \cdot V} = I_S \cdot e^{\alpha V_{BE0}} \quad (8)$$
$$I_1 \div I_S \cdot e^{q/kT \cdot V} = I_S \cdot e^{\alpha V_{BE1}} \quad (9)$$
$$I_2 \div I_S \cdot e^{q/kT \cdot V} = I_S \cdot e^{\alpha V_{BE2}} \quad (10)$$

wherein $I_S$ represents an input current coefficient of the respective transistors and which is seen to be substantially the same for all of the transistors in view of the assumed identity of operating characteristics.

From equations (8), (9) and (10) the respective base-emitter voltage drops are derived as:

$$V_{BE0} = \frac{1}{\alpha} \ln \frac{I_o}{I_S} \quad (11)$$

$$V_{BE1} = \frac{1}{\alpha} \ln \frac{I_1}{I_S} \quad (12)$$

$$V_{BE2} = \frac{1}{\alpha} \ln \frac{I_2}{I_S} \quad (13)$$

Equations (11), (12) and (13) can be inserted into equation (7) above to obtain the following:

$$2 \cdot \frac{1}{\alpha} \ln \frac{I_o}{I_S} = \frac{1}{\alpha} \ln \frac{I_1}{I_S} + \frac{1}{\alpha} \ln \frac{I_2}{I_S} \quad (13A)$$

From equation (13A) the output curreent $I_2$ can be matematically expressed as:

$$I_2 = \frac{1}{I_1} \cdot I_o^2 \quad (14)$$

It is appreciated that the term $I_1$ is the current flowing through the emitter-follower stage 17 and is a constant current derived from the current source 15. Hence, the factor $1/I_1$ is a constant factor. It is thus seen that the output current is proportional to the input current amplified by a power of 2. Accordingly, the non-linear amplifier circuit schematically illustrated in FIG. 2 operates as a 2-nd power non-linear amplifier.

An embodiment of a general n-th power non-linear amplifier in accordance with the present invention will now be described with reference to FIG. 3. The amplification power $n$ of the non-linear amplifier illustrated therein is equal to or greater than 3. It will, of course, be recognized that, where $n$ is equal to 2, the preferable embodiment is as illustrated in FIG. 2. Thus, in general, and as will be seen, the non-linear amplifier generally illustrated in FIG. 3 admits of a power of amplification equal to $n$ wherein $n$ is an integer greater than 1.

Figure 3:
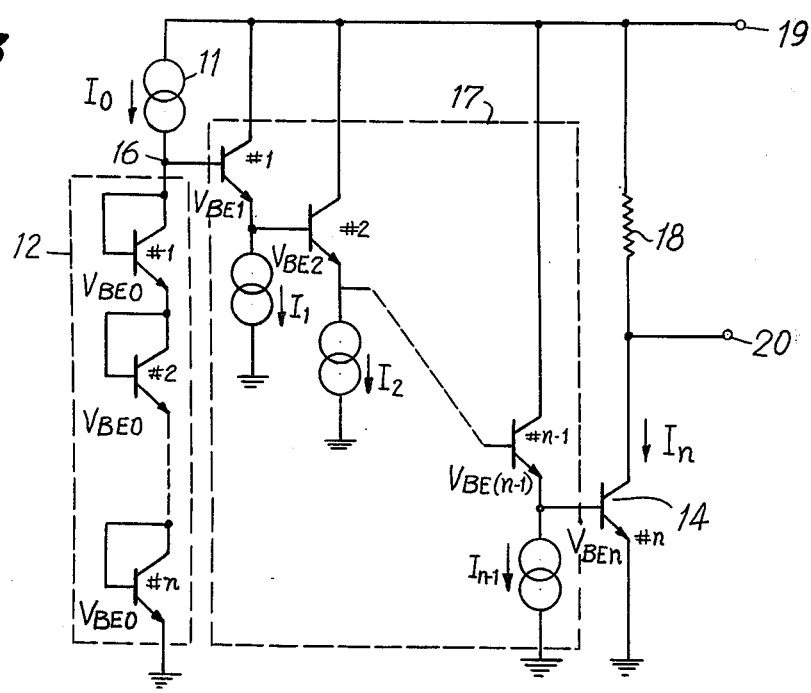
FIG. 3 is a schematic representation of a general non-linear amplifier in accordance with the teachings of the present invention.

The n-th power non-linear amplifier of FIG. 3 is substantially similar to the simplified schematic diagram of FIG. 2 in that an amplifying transistor 14 is adapted to receive an input signal current supplied thereto through an emitter-follower stage 17 from a junction 16. The junction 16 is also connected to a series of P-N junctions 12. Moreover, the input signal is supplied to the junction 16 by an input current source 11. More particularly, the emitter-follower stage 17 is comprised of $(n-1)$ emitter-follower transistors connected in cascade wherein each emitter-follower transistor includes a constant current source connected to its emitter circuit. For purposes of illustration, the constant current sources are designated $I_1, I_2, \ldots I_{(n-1)}$ for the respective $(n-1)$ emitter-follower transistors. The output of the $(n-1)$th emitter-follower transistor is seen to be the output of the emitter-follower stage 17 and is coupled to the base electrode of the amplifying transistor 14.

The series of P-N junctions 12 is here comprised of $n$ P-N junctions, each being formed of a diode-connected transistor.

In mathematically describing the operation of the n-th power non-linear amplifier, it will be assumed that the forward voltage drop across each of the P-N junctions included in the series 12 is designated as $V_{BE0}$, and that the base-emitter voltage drops across the respective emitter-follower transistors included in the emitter-follower stage 17 are designated as $V_{BE1}$, $V_{BE2}$ ... $V_{BE(n-1)}$. The base-emitter voltage drop of the amplifying transistor 14 is designated as $V_{BEn}$. Accordingly, the voltage relationship at junction 16 can be expressed as:

$$n V_{BE0} = V_{BE1} + V_{BE2} + \ldots V_{BEn} \quad (15)$$

As was the case with respect to the embodiment illustrated in FIG. 2, the currents flowing through the respective base electrodes of the illustrated transistors are negligible and, therefore, can be neglected. Consequently, the input signal current $I_o$ flowing through the series of P-N junctions 12 as well as the collector-emitter current flowing through each of the emitter-follower transistors included in the emitter-follower stage 17 and the collector-emitter current $I_n$ flowing through the amplifying transistor 14 are given as:

$$I_o \div I_S \cdot e^{q/kT \cdot V_{BE0}} = I_S \cdot e^{\alpha V_{BE0}}$$
$$I_1 \div I_S \cdot e^{q/kT \cdot V_{BE1}} = I_S \cdot e^{\alpha V_{BE1}}$$
$$I_2 \div I_S \cdot e^{q/kT \cdot V_{BE2}} = I_S \cdot e^{\alpha V_{BE2}}$$

$$I_n \div I_S \cdot e^{q/kT \cdot V_{BEn}} = I_S \cdot e^{\alpha V_{BEn}} \quad (16)$$

By rearranging the terms of equationsn (16) the respective voltage can be expressed as:

$$V_{BE0} = \frac{1}{\alpha} \ln \frac{I_o}{I_S}$$

$$V_{BE1} = \frac{1}{\alpha} \ln \frac{I_1}{I_S}$$

$$V_{BE2} = \frac{1}{\alpha} \ln \frac{I_2}{I_S}$$

$$\vdots$$

$$V_{BEn} = \frac{1}{\alpha} \ln \frac{I_n}{I_S} \quad (17)$$

Now, by substituting equations (17) into equation (15) the following is obtained:

$$n \cdot \frac{1}{\alpha} \cdot \ln \frac{I_o}{I_S} = \frac{1}{\alpha} \cdot \ln \frac{I_1}{I_S} + \frac{1}{\alpha} \cdot \ln \frac{I_2}{I_S} + \ldots + \frac{1}{\alpha} \cdot \ln \frac{I_n}{I_S} \quad (17A)$$

Solving for the output current $I_n$, the output current is defined as:

$$I_n = \frac{1}{I_1 . I_2 . I_3 . \ldots . I_{(n-1)}} I_o{}^n \tag{18}$$

It is appreciated that the terms $I_1, I_2, \ldots I_{(n-1)}$ are the respective constant currents produced by the constant current sources connected in the emitter circuits of the respective emitter-follower transistors included in the emitter-follower stage 17. These terms are constant so that the factor $$\frac{1}{I_1 . I_2 . I_3 \ldots I_{(n-1)}}$$

is a constant factor. Accordingly, equation (18) represents that the input current $I_o$ is amplified by a power of $n$ to attain the output current $I_n$, and that the output current $I_n$ is proportional to the input current $I_o$ amplified to the n-th power. Thus, it is seen that the circuit schematically illustrated in FIG. 3 is operable as an n-th power non-linear amplifier.

When considering the junction 16 as illustrated in FIGS. 2 and 3, it is seen that parallel paths comprising plural P-N junctions are provided. The number of P-N junctions included in each parallel path is equal. Thus, in FIG. 2, a first path is formed of the series of P-N junctions 12 and is comprised of 2 P-N junctions, each being formed by the base-emitter junction of a diode-connected transistor. In the other parallel path, a first P-N junction is formed by the base-emitter junction of the emitter-follower transistor 13 included in the emitter-follower stage 17 and a second P-N junction is formed by the base-emitter junction of the amplifying transistor 14. In FIG. 3, the first path is again comprised of the series of P-N junctions and includes P-N junctions, each being formed by the baseemitter junction of a diode-connected transistor. The other parallel path is seen to comprise (n-1) P-N junction, each being formed of a base-emitter junction included in the emitter-follower stage 17 and the n-th base-emitter junction of the amplifying transistor 14. Since the number of P-N junctions included in each parallel path is equal, and is here formed of a base-emitter junction, it should be recognized that voltage variations thereacross that are attributable to temperature variations are cancelled. Consequently, the n-th power non-linear amplifier of the present invention is not sensitive to temperature variations. Hence, the input signal is amplified by a power on $n$ and the resultant output signal is not deleteriously affected by temperature changes.

Figure 4:
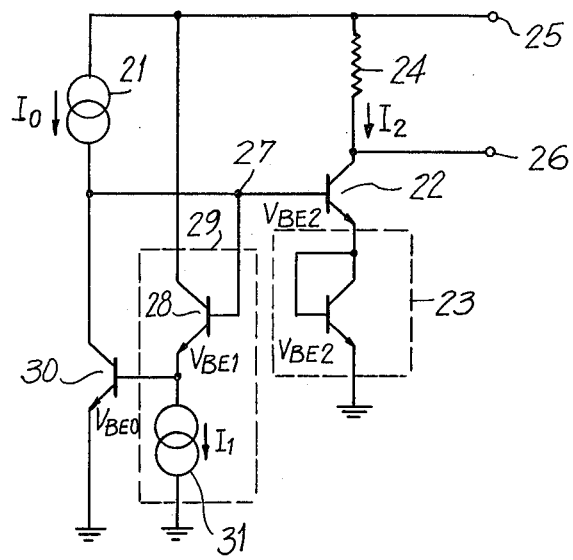
FIG. 4 is a schematic representation of a simplified non-linear amplifier in accordance with the teachings of the present invention wherein the input signal is amplified by a power of one-half.

Referring now to FIG. 4, there is illustrated a schematic representation of a simplified non-linear amplifier wherein an input signal is amplified by a power or 1/2. The circuit is comprised of an amplifying transistor 22, a series of P-N junctions 23 and an emitter-follower stage 29. The amplifying tansistor 22 is adapted to receive an input signal supplied to the base electrode thereof and to produce an output signal at its collector electrode. Accordingly, the collector electrode of the amplifyingn transistor is coupled to a source of energizing potential 25 by a load impedance 24, and an output terminal 26 is derived from the collector electrode. The input signal supplied to the amplifying transistor is applied thereto through the input current source 21.

In accordance with the simplified embodiment depicted to FIG. 4, the series of P-N junctions 23 is comprised of a single P-N junction formed of a diode-connected transistor. This series of P-N junctions serves to couple the emitter electrode of the amplifying transistor 22 to a reference potential, such as ground.

A junction 27, through which the input signal is supplied to the base electrode of the amplifying transistor 22, is additionally connected to the emitter-follower stage 29. In the simplified embodiment depicted herein, the emitter-follower stage 29 is comprised of an emitter-follower transistor 28 having a constant current source 31 connected in its emitter circuit. The output of the emitter-follower stage, i.e., the emitter electrode of the emitter-follower transistor 28, is connected to the base electrode of a further transistor 30, the latter having its emitter electrode connected to ground. The collector electrode of the further transistor is directly connected to the aforenoted junction 27.

The respective transistor devices are selected such that the operating characteristics thereof, and in particular, the P-N junction characteristics thereof, are all the same. It is appreciated that this is readily attained in accordance with conventional integrated circuit technology.

The operation of the simplified circuit embodiment depicted in FIG. 4 will now be mathematically described. Let it be assumed that the base-emitter voltage of the further transistor 30 is designated $V_{BE0}$, the base-emitter voltage across the emitter-follower transistor 28 included in the emitter-follower stage 29 is designated as $V_{BE1}$ and that the voltage drop across the P-N junction included in the series of P-N junctions 23 is designated $V_{BE2}$. Additionally, the base-emitter voltage drop of the amplifying transistor 22 is assumed to be equal to the P-N junction voltage drop and, hence, is designated $V_{BE2}$. Therefore, with respect to the junction 27, the following expression represents the voltage relationship thereat:

$$V_{BE0} + V_{BE1} = 2V_{BE2} \tag{19}$$

Now, if the currents flowing through the respective base electrodes of the illustrated transistors are assumed to be negligible, such currents can be omitted from further consideration so that the current $I_o$ flowing through the further transistor 30, the current $I_1$ flowing through the emitter-follower stage 29, and the current $I_2$ flowing through the amplifying transistor 22 and the series P-N junctions 23 can be expressed as:

$$\begin{aligned} I_o \div I_s \, e^{q/kT \, V_{BE0}} &= I_s \, e^{\alpha V_{BE0}} \\ I_1 \div I_s \, e^{q/kT \, V_{BE1}} &= I_s \, e^{\alpha V_{BE1}} \\ I_2 \div I_s \, e^{q/kT \, V_{BE2}} &= I_s \, e^{\alpha V_{BE2}} \end{aligned} \tag{20}$$

By rearranging terms, the respective voltages expressed in equations (20) are found to be:

$$\begin{aligned} V_{BE0} &= \frac{1}{\alpha} \cdot \ln \frac{I_o}{I_s} \\ V_{BE1} &= \frac{1}{\alpha} \cdot \ln \frac{I_1}{I_s} \\ V_{BE2} &= \frac{1}{\alpha} \cdot \ln \frac{I_2}{I_s} \end{aligned} \tag{21}$$

The voltages represented in equations (21) can be substituted into equation (19) to obtain:

$$\frac{1}{\alpha} \ln \frac{I_o}{I_s} + \frac{1}{\alpha} \ln \frac{I_1}{I_s} = 2 \frac{1}{\alpha} \ln \frac{I_2}{I_s} \tag{21A}$$

Solving for the output current $I_2$, the output current is represented as:

$$I_2 = I_1^{1/2} \cdot I_o^{1/2} \qquad (22)$$

It is appreciated that the term $I_1$ in equation (22) represents the constant current flowing through the emitter-follower stage 29 as produced by the constant current source connected in the emitter circuit of 1/2 the emitter-follower transistor 28. Accordingly, the term $I_1$ is a constant factor. Hence, as expressed in equation (22), the input current $I_o$ is amplified by a power of one-half to obtain the output current $I_2$. Stated otherwise, the output current is proportional to the input current by the power of one-half. Hence, the simplified circuit diagram depicted in FIG. 4 is illustrative of a one-half power nonlinear amplifier.

Figure 5:
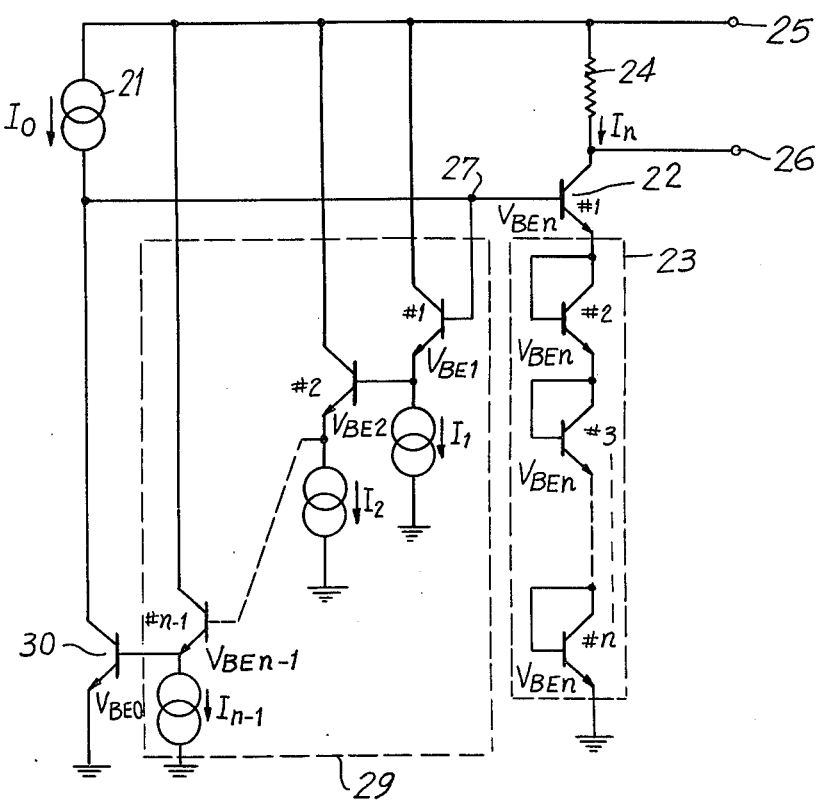
FIG. 5 is a schematic representation of a general non-linear amplifier in accordance with the teachings of the present invention wherein the input signal is amplified by a power of $1/n$.

A generalized $1/n$ power non-linear amplifier will now be described with reference to FIG. 5. The $1/n$ power non-linear amplifier is comprised of an amplifying transistor 22, a series of P-N junctions 23, an emitter-follower stage 29 and a further transistor 30, as aforedescribed with respect to FIG. 4. However, in the general embodiment depicted in FIG. 5, the series of P-N junctions 23 is comprised of $(n-1)$ series connected P-N junctions, each comrprising a diodeconnected transistor such that the P-N junction is formed of the base-emitter junction of each transistor. Similarly, the emitter-follower stage 29 is comprised of $(n-1)$ cascaded emitter-follower transistors wherenin the base-emitter junctions of the emitter-follower transistors are connected in series. A constant current source is connected in each of the respective emitter circuits of the emitter-follower transistors. As is illustrated, the output of the emitter-follower stage 29, that is, the output of the $(n-1)$th emitter-follower transistor is connected to the base electrode of the further transistor 30, the latter having its base-emitter junction connected to ground.

In accordance with the now well understood mathematical analysis of the illustrated non-linear amplifier, the voltage relationship, taken with respect to junction 27, can be expressed are:

$$V_{BE0} + V_{BE1} + V_{BE2} + \ldots + V_{BE(n-1)} = n V_{BEn} \qquad (23)$$

wherein $V_{BE1}, V_{BE2} \ldots V_{BE(n-1)}$ are the base-emitter voltage drops across the respective emitter-followe transitors included in the emitter-follower stage 27; $V_{BE0}$ is the baseemitter voltage of the further transistor 30; and $V_{BEn}$ is the base-emitter voltage of the amplifying transistor 22 or of each of the diode-connected transistors included in the series of P-N junctions 23.

If the negligible currents flowing through the respective transistor bases are omitted, the collector-emitter transistor currents can be expressed as:

$$I_o \div I_S \cdot e^{q/kT \cdot V_{BE0}} = I_S \cdot e^{\alpha \cdot V_{BE0}}$$
$$I_1 \div I_S \cdot e^{q/kT \cdot V_{BE1}} = I_S \cdot e^{\alpha \cdot V_{BE1}}$$
$$I_2 \div I_S \cdot e^{q/kT \cdot V_{BE2}} = I_S \cdot e^{\alpha \cdot V_{BE2}}$$
$$I_{(n-1)} \div I_S \cdot e^{q/kT \cdot V_{BE(n-1)}} = I_S \cdot e^{\alpha \cdot V_{BE(n-1)}}$$
$$I_n \div I_S \cdot e^{q/kT \cdot V_{BEn}} = I_S \cdot e^{\alpha \cdot V_{BEn}} \qquad (24)$$

wherein the currents $I_1, I_2, \ldots I_{(n-1)}$ are the currents produced by the respective constant current sources connected in the emitter circuits of the emitter-follower transistors included in the emitter-follower stage 29 and the current $I_n$ is the output current flowing through the amplifying transistor 22 and, additionally, through the series of P-N junctions 23.

The voltages expressed in equations (24) can be represented as:

$$V_{BE0} = \frac{1}{\alpha} \cdot \ln \frac{I_o}{I_S}$$
$$V_{BE1} = \frac{1}{\alpha} \cdot \ln \frac{I_1}{I_S}$$
$$V_{BE2} = \frac{1}{\alpha} \cdot \ln \frac{I_2}{I_S}$$
$$\vdots$$
$$V_{BE(n-1)} = \frac{1}{\alpha} \cdot \ln \frac{I_{(n-1)}}{I_S}$$
$$V_{BEn} = \frac{1}{\alpha} \cdot \ln \frac{I_n}{I_S} \qquad (25)$$

Now, if equations (25) are inserted into the equation (23), the following is obtained:

$$\frac{1}{\alpha} \cdot \ln \frac{I_o}{I_S} + \frac{1}{\alpha} \cdot \ln \frac{I_1}{I_S} + \frac{1}{\alpha} \cdot \ln \frac{I_2}{I_S} + \ldots + \frac{1}{\alpha} \cdot \ln \frac{I_{(n-1)}}{I_S} = n \cdot \frac{1}{\alpha} \cdot \ln \frac{I_n}{I_S} \qquad (25A)$$

By rearranging terms, the output current $I_n$ can be expressed as:

$$I_n = (I_1 \cdot I_2 \cdots I_{n-1})^{\frac{1}{n}} \cdot I_o^{\frac{1}{n}} \qquad (26)$$

It is appreciated that the factor $(I_1 \cdot I_2 \ldots I_{n-1})^{n/1}$ is dependent solely upon the constant current sources and, therefore, is a constant factor. Accordingly, the output current produced by the non-linear amplifier illustrated in FIG. 5 is proportional to the input current by a power of $1/n$. Stated otherwise, the non-linear amplifier is operable to amplify the input current $I_o$ by a power of $1/n$.

It is appreciated that, in the illustrated embodiment, each base-emitter junction of the emitter-follower transistors included in the emitter-follower stage 29 as a P-N junction. Accordingly, the number of P-N junctions included in the series of P-N junctions 23 is equal to the number of P-N junctions that are connected in cascade in the emitter-follower stage 29. Hence, voltage variations in these P-N junctions that are attributable to temperature changes are cancelled so as to maintain the base-emitter voltage of the amplifying transistor 22 substantially constant. Amplification of a power of $1/n$ is thus achieved regardless of temperature variations. Thus, the illustrative embodiment of FIG. 5 operates as a $1/n$ power non-linear amplifier that is temperature stable, wherein n is greater than 1.

Figure 6:
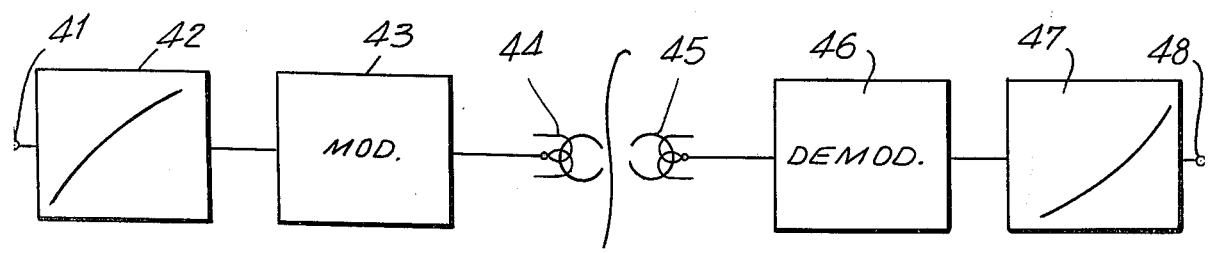
FIG. 6 is a block diagram representing one application wherein the teachings of the present invention are readily utilized.

Referring now to FIG. 6, a block diagram of one typical application of the teachings of the present invention is illustrated. More particularly, FIG. 6 is a block diagram of tape recording apparatus, and in particular, a video tape recorder/reproducer wherein an $n$-th power non-linear amplifier and a $1/n$-th power non-linear amplifier are used to process information signals. In the illustrated embodiment, a signal recording circuit adapted to record signals on a magnetic medium, such a magnetic tape T, comprises a de-emphasis circuit 42 and a modulator 43. A circuit shaped to reproduce signals from the magnetic medium is comprised of a demodulator 46 and an emphasis circuit 47.

The de-emphasis circuit 42 includes a 1/n-th power non-linear amplifier of the type described hereinabove with respect to FIG. 5, and includes an input coupled to a signal input terminal 41. This non-linear de-emphasis circuit is adapted to compress the signal supplied thereto so that a compressed signal is recorded on the magnetic medium. After the input signal is compressed to the desired level, the output of the non-linear de-emphasis circuit is supplied to the modulator 43. This modulator comprises a frequency modulator for frequency modulating the compressed signal and for supplying same to a magnetic recording head 44 whereby the compressed, frequency-modulated signal is recorded on the magnetic medium.

In the signal reproducing circuit, a playback magnetic head 45 supplies recorded signals to the demodulator 46. It is appreciated that the demodulator comprises a frequency demodulator circuit adapted to produce a compressed signal at its output that is substantially similar to the signal that had been supplied to the modulator 43. This demodulated, compressed signal is applied to the emphasis circuit 47 which includes the n-th power non-linear amplifier previously described with respect to FIG. 3. The non-linear emphasis circuit is adapted to expand the reproduced signal to a desired level. The expanded signal is derived from the signal output terminal 48 which is coupled to the non-linear emphasis circuit.

Although the non-linear amplifier of the present invention can be readily utilized in various applications, the application thereof to tape recording techniques and, in particular, to a video tape recording system permits the recording and reproducing of a signal having a relatively high level without concomitant tape saturation. In addition, the signal processing circuits of such VTR apparatus exhibit relatively stable and reliable operating characteristics and are not temperature sensistive.

It should now be readily apparent that the n-th and the 1/n-th power non-linear amplifiers of the present invention can be easily constructed whereby n can be any desired integer greater than 1. It is seen that the input signal to be amplified is supplied to parallel conducting paths each being comprised of n P-N junctions. In one conducting path, series connected P-N junctions are formed of, for example, diode-connected transistors. In the other conducting path the P-N junctions are formed of cascaded emitter-follower transistors wherein the base-emitter junctions thereof correspond to such P-N junctions. In the n-th power non-linear amplifier embodiment, the amplifying transistor is connected in t he conducting path including the emitterfollowers whereby the base-emitter junction of the amplifying transistor is included as one of the P-N junctions in that conducting path. In the 1/n-th non-linear amplifier embodiment, the amplifying transistor is connected in the other conducting path, that is, the conducting path comprised of thee series of P-N junctions formed of, for exampled, diodeconnected transistors. Nevertheless, it should be appreciated that the total number of P-N junctions included in each conducting path is equal. Thus, it is seen that the exponential factor $n$ can be readily selected merely by selecting the number of P-N junctions to be included in the respective paralled conducting paths. In this manner, the exponential relationship between the input and output signals can be chosen. The exponential curve representing the amplification of the non-linear amplifier can thus be easily selected.

It is readily appreciated that the various embodiments of the non-linear amplifier, as shown and described hereinabove, include merely a single resistive element, i.e., the amplifying transistor load resistor. Accordingly, the non-linear amplifier of the present invention is readily adapted to integrated circuit fabrication techniques.

While the present invention has been particularly shown and described with reference to a plurality of preferred embodiments thereof, it will be obvious to those skilled in the art that various changes and modifications in form and details may be made without departing from the spirit and scope of the invention. It is therefore intended that the appended claims be interpreted as including all such changes and modifications.

What is claimed is:

1. A temperature-stable non-linear amplifier comprising input means for supplying an input signal to be amplified, a pair of parallel conducting paths connected to said imput means, each of said conducting paths being comprised of n P-N junctions connected in series where n is an integer greater than 1, $(n-1)$ emitter-follower transistors included in one of said conducting paths and having said P-N junctions of said one path formed by their respective base-emitter junctions connected in series, constant current sources connected in the emitter circuits of said $(n-1)$ emitter-follower transistors, respectively, $(n-1)$ diode-connected transistors included in the other of said conducting paths and having their respective baseemitter junctionsn connected in series to form said P-N junctions of said other path, and amplifying transistor means included in one of said conducting paths for producing, at an output terminal thereof, a signal exponentially proportional to said input signal; and wherein said amplifying transistor means is connected in series with said $(n-1)$ diode-connected transistors such that the P-N junction formed by the base-emitter junction of said amplifying transistor means is connected in series with said $(n-1)$ diodeconnected transistor base-emitter junctions in one of said conducting paths; and said $(n-1)$ emitter-follower transistors are connected in cascade with a further transistor to thereby form said P-N junctions of said $(n-1)$ emitter-follower transistor base-emitter junctions and said further transistor base-emitter junctions in the other conducting path, such that said output signal is proportional to the 1/n-th power of said input signal.

2. A non-linear amplifier, comprising:
   an amplifying transistor for amplifying an input signal;
   an input terminal for receiving said input signal, said input terminal being connected to said amplifying transistor;
   a series of $(n-1)$ P-N junctions connected in series with the P-N junction defined by the base-emitter junction of said amplifying transistor for providing a predetermined bias voltage for said amplifying transistor, and wherein $n$ is an integer greater than unity; and
   emitter-follower means connected to said input terminal, said emitter follower means comprising $(n-1)$ emitter-follower transistors connected in cascade such that the base-emitter junctions of said emitter-follower transistors form a first path which is in parallel with a second path defined by said amplifying transistor and series of P-N junctions such that said input signal is amplified by the power of $1/n$.

3. A non-linear amplifier in accordance with claim 2 and further comprising a further transistor connected in cascade with said cascaded emitter-follower transistors such that the base-emitter junctions of said emitter-follower transistos and said further transistor are connected in a first series circuit.

4. A non-linear transistor in accordance with claim 3 wherein constant current sources are connected in the emitter circuits of said $(n-1)$ emitter-follower transistors, respectively.

5. A non-linear amplifier in accordance with claim 4 wherein said $(n-1)$ P-N junctions comprise $(n-1)$ diode-connected transistors; the base-emitter junctions of said $(n-1)$ diode-connected transistors being connected to the base-emitter junction of said amplifying transistor in a second series circuit, said first and second series of circuits being connected in parallel.

6. A non-linear amplifier for producing an output signal which is proportional to an input signal amplified by an exponential factor related to n where n is an integer greater than unity, comprising:

an input terminal for receiving said input signal;

first and second parallel conducting paths connected to said input terminal, said first conducting path being formed of n P-N junctions connected in series relation;

said second conducting path being formed of series-connected base-emitter junctions of $(n-1)$ emitter-follower transistors; and an amplifying transistor having its base-emitter junction connected in series with one of said first and second conducting paths for receiving said input signal and for producing said output signal; and wherein the base-emitter junction of said amplifying transistor is connected as one of said n P-N junctions forming said first conducting path; and said $(n-1)$ emitterfollower transistors are connected in cascade with a further transistor to thereby form $n$ P-N junctions in said second conducting path such that said output signal is proportional to the $1/n$-th power of said input signal.

* * * * *

UNITED STATES PATENT OFFICE
CERTIFICATE OF CORRECTION

Patent No. 3,935,478      Dated Jan. 27, 1976

Inventor(s) Takashi Okada et al

It is certified that error appears in the above-identified patent and that said Letters Patent are hereby corrected as shown below:

Column 2, line 6, change "voltge" to --voltage--

Column 2, line 43, change "Schematically" to --schematically--

Column 3, line 15, change "thebase" to --the base--

Column 3, equations (2) and (3), change " $\div$ " to -- $\doteq$ --

Column 3, line 36, change "ewuations" to --equations--

Column 4, line 20, change "cirucit" to --circuit--

Column 4, line 30, change "ftransistor" to --transistor--

Column 4, line 61, change "followr" to --follower--

Column 4, equation (7), change "$2V_{BEO} = V_{Be1} + V_{BE2}$" to

--$2V_{BEO} = V_{BE1} + V_{BE2}$--

UNITED STATES PATENT OFFICE
CERTIFICATE OF CORRECTION

Patent No. 3,935,478                    Dated Jan. 27, 1976

Inventor(s) Takashi Okada et al          Page 2 of 5

It is certified that error appears in the above-identified patent and that said Letters Patent are hereby corrected as shown below:

Column 5, equation (8), change $$I_0 \doteq I_S \cdot e^{q/kT \ V} = I_S \cdot e^{\alpha V_{BEO}}$$

to $$-- I_o \doteq I_S \cdot e^{q/kT \ V_{BEO}} = I_S \cdot e^{\alpha V_{BEO}} --$$

Column 5, equation (9), change $$I_1 \doteq I_S \cdot e^{q/kT \ V} = I_S \cdot E^{\alpha V_{BF1}}$$

to $$-- I_1 \doteq I_S \cdot e^{q/kT \ V_{BE1}} = I_S \cdot e^{\alpha V_{BE1}} --$$

Column 5, equation (10), change $$I_2 \doteq I_S \cdot e^{q/kT \ V} = I_S \cdot e^{\alpha V_{BE2}}$$

to $$-- I_2 \doteq I_S \cdot e^{q/kT \ V_{BE2}} = I_S \cdot e^{\alpha V_{BE2}} --$$

UNITED STATES PATENT OFFICE
CERTIFICATE OF CORRECTION

Patent No. 3,935,478     Dated Jan. 27, 1976

Inventor(s)     Takashi Okada et al     Page 3 of 5

It is certified that error appears in the above-identified patent and that said Letters Patent are hereby corrected as shown below:

Column 5, line 34, change "curreent" to --current--

Column 6, line 5, change "to" to --in--

Column 6, line 35, change "collectoremitter" to

--collector-emitter--

Column 6, equation (16), change "$\div$" to --$\doteq$--, four occurrences

Column 6, line 45, change "equationsn" to --equations--

Column 6, line 46, change "voltage" to --voltages--

Column 7, line 61, change "amplifyingn" to --amplifying--

Column 8, equation (20), change "$\div$" to --$\doteq$--, three occurrences

Column 9, line 8, change "$I_1$" to --$I_1^{1/2}$--

Column 9, line 28, change "comrpising" to --comprising--

Column 9, line 28, change "diodecon-" to --diode-con- --

UNITED STATES PATENT OFFICE
CERTIFICATE OF CORRECTION

Patent No. 3,935,478             Dated  Jan. 27, 1976

Inventor(s)    Takashi Okada et al                Page 4 of 5

It is certified that error appears in the above-identified patent and that said Letters Patent are hereby corrected as shown below:

Column 9, line 32, change "hwerenin" to --wherein--

Column 9, equation (24), change "$\div$" to --$\doteq$--, five times;

between lines 3 and 4, insert four vertical dots;

and first line of equation, change "1s" to --$1_s$--

Column 9, line 48, change "followe" to --follower--

Column 10, equation 26, change $$"1_n = (1_1 \cdot I_2 \cdot \ldots \cdot I_{n-1}) \cdot \frac{1}{n} \cdot I_o \frac{1}{n}"$$

to $$--I_n = (1_1 \cdot I_2 \cdot \ldots \cdot I_{n-1}) \cdot \frac{1}{n} \cdot I_o \frac{1}{n}--$$

Column 10, line 66, change "shaped" to --adapted--

Column 11, line 53, change "t he" to --the--

Column 11, line 59, change "thee" to --the--

UNITED STATES PATENT OFFICE
CERTIFICATE OF CORRECTION

Patent No. 3,935,478     Dated Jan. 27, 1976

Inventor(s) Takashi Okada et al

It is certified that error appears in the above-identified patent and that said Letters Patent are hereby corrected as shown below:

In the Claims:

Column 12, line 32, change "junctionsn" to --junctions--

Column 14, line 12, change "s eries" to --series--

Signed and Sealed this

Eleventh Day of January 1977

[SEAL]

Attest:

RUTH C. MASON
*Attesting Officer*

C. MARSHALL DANN
*Commissioner of Patents and Trademarks*